(12) United States Patent
Derner et al.

(10) Patent No.: US 11,238,913 B2
(45) Date of Patent: *Feb. 1, 2022

(54) CELL-BASED REFERENCE VOLTAGE GENERATION

(71) Applicant: Micron Technology, inc., Boise, ID (US)

(72) Inventors: Scott James Derner, Boise, ID (US); Christopher John Kawamura, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/806,858

(22) Filed: Mar. 2, 2020

(65) Prior Publication Data

US 2020/0202917 A1 Jun. 25, 2020

Related U.S. Application Data

(60) Continuation of application No. 16/183,021, filed on Nov. 7, 2018, now Pat. No. 10,607,677, which is a (Continued)

(51) Int. Cl.
*G11C 11/22* (2006.01)
*G11C 7/14* (2006.01)

(52) U.S. Cl.
CPC ......... *G11C 11/2273* (2013.01); *G11C 7/14* (2013.01); *G11C 11/221* (2013.01); *G11C 11/2255* (2013.01); *G11C 11/2297* (2013.01)

(58) Field of Classification Search
CPC ... G11C 11/2273; G11C 7/14; G11C 11/2255; G11C 11/221; G11C 11/2297; G11C 11/2275
(Continued)

(56) References Cited

U.S. PATENT DOCUMENTS 5,218,566 A * 6/1993 Papaliolios ............ G11C 11/22
365/145
5,621,680 A 4/1997 Newman et al.
(Continued)

FOREIGN PATENT DOCUMENTS

JP H05242684 A 9/1993
JP 07192476 A 7/1995
(Continued)

OTHER PUBLICATIONS

JPO, "Notice of Rejection Ground," issued in connection with Japanese Patent Application No. 2019-211766, dated Mar. 10, 2020 (10 pages).
(Continued)

*Primary Examiner* — Fernando Hidalgo
(74) *Attorney, Agent, or Firm* — Holland & Hart LLP

(57) ABSTRACT

Methods, systems, and devices for operating a ferroelectric memory cell or cells are described. A first ferroelectric memory cell may be initialized to a first state and a second ferroelectric memory cell may be initialized to a different state. Each state may have a corresponding digit line voltage. The digit lines of the first and second ferroelectric memory cells may be connected so that charge-sharing occurs between the two digit lines. The voltage resulting from the charge-sharing between the two digit lines may be used by other components as a reference voltage.

17 Claims, 9 Drawing Sheets

Related U.S. Application Data division of application No. 15/858,747, filed on Dec. 29, 2017, now Pat. No. 10,153,023, which is a continuation of application No. 15/676,608, filed on Aug. 14, 2017, now Pat. No. 9,892,777, which is a division of application No. 15/012,566, filed on Feb. 1, 2016, now Pat. No. 9,734,886.

(58) Field of Classification Search
USPC .......................................................... 365/145
See application file for complete search history.

(56) References Cited

U.S. PATENT DOCUMENTS

| | | | |
|---|---|---|---|
| 5,737,260 A | 4/1998 | Takata et al. | |
| 5,751,628 A * | 5/1998 | Hirano | G11C 11/22 365/145 |
| 6,704,218 B2 | 3/2004 | Riekes et al. | |
| 6,819,584 B2 | 11/2004 | Noh | |
| 6,856,535 B2 | 2/2005 | Madan | |
| 7,173,844 B2 | 2/2007 | Lee et al. | |
| 7,313,010 B2 | 12/2007 | Sun et al. | |
| 8,228,707 B2 * | 7/2012 | Nishimura | G11C 11/22 365/145 |
| 8,274,846 B2 | 9/2012 | Shiga et al. | |
| 2002/0131292 A1 | 9/2002 | Ashikaga | |
| 2003/0185059 A1 | 10/2003 | Takahashi | |
| 2004/0090814 A1 | 5/2004 | Takahashi | |
| 2006/0245286 A1 | 11/2006 | Sun et al. | |
| 2011/0051495 A1 * | 3/2011 | Ito | G11C 5/147 365/148 |
| 2015/0235689 A1 * | 8/2015 | Kawashima | G11C 11/2275 365/145 |
| 2016/0343422 A1 | 11/2016 | Marotta et al. | |
| 2018/0012642 A1 * | 1/2018 | Rodriguez-Latorre | H03M 13/2945 |

FOREIGN PATENT DOCUMENTS

| | | | |
|---|---|---|---|
| JP | H07192476 A | 7/1995 |
| JP | H09231775 A | 9/1997 |
| JP | H09265785 A | 10/1997 |
| JP | H1050075 A | 2/1998 |
| JP | 2002269971 A | 9/2002 |
| JP | 2003288780 A | 10/2003 |
| JP | 2004164713 A | 6/2004 |
| JP | 2005235366 A | 9/2005 |
| JP | 2006004535 A | 1/2006 |

OTHER PUBLICATIONS

European Patent Office, "Partial Supplementary European Search Report," issued in connection with European Patent Application No. 17747936.7, dated Jul. 24, 2019 (16 pages).

ISA/KR, International Search Report and Written Opinion of the International Searching Authority, Int'l. Appl. No. PCT/US2017/014922, Apr. 25, 2017, Korean Intellectual Property Office, Seo-gu, Daejeon, Republic of Korea, 8 pgs.

Japan Patent Office, "Office Action," issued in connection with Japanese Patent Application No. 2018-539270, dated Apr. 9, 2019 (7 pages).

Korean Intellectual Property Office, "Notice of Reasons for Rejection," issued in connection with Korean Patent Application No. 10-2020-7011375, dated Mar. 29, 2021 (8 pages with translation).

Japan Patent Office, "Notice of Rejection Ground," issued in connection with Japanese Application No. 2019-211766, dated Jun. 29, 2021 (14 pages).

* cited by examiner

CELL-BASED REFERENCE VOLTAGE GENERATION

CROSS REFERENCE

The present Application for Patent is a continuation of U.S. patent application Ser. No. 16/183,021 by Derner et al., entitled "Cell-Based Reference Voltage Generation," filed Nov. 7, 2018, which is a divisional of U.S. patent application Ser. No. 15/858,747 by Derner et al., entitled "Cell-Based Reference Voltage Generation," filed Dec. 29, 2017, which is a continuation of U.S. patent application Ser. No. 15/676,608 by Derner et al., entitled "Cell-Based Reference Voltage Generation," filed Aug. 14, 2017, which is a divisional of U.S. patent application Ser. No. 15/012,566 by Derner et al., entitled "Cell-Based Reference Voltage Generation," filed Feb. 1, 2016, assigned to the assignee hereof, and each of which is expressly incorporated by reference in its entirety herein.

BACKGROUND

The following relates generally to memory devices and more specifically to cell-based reference voltage generation.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. A device using FeRAM may use a predetermined reference voltage for sensing the states stored by the FeRAM memory cells. But this predetermined reference voltage may not be tailored to the device. Additionally, this reference voltage may vary with cell characteristics over time, causing further discrepancy between a preferable reference voltage value and the actual reference voltage value. Using an incorrect reference voltage may corrupt the sensing operations of the device, resulting in inaccurate reads and decreased performance.

BRIEF DESCRIPTION OF THE DRAWINGS

The disclosure herein refers to and includes the following figures.

DETAILED DESCRIPTION

Figure 1:
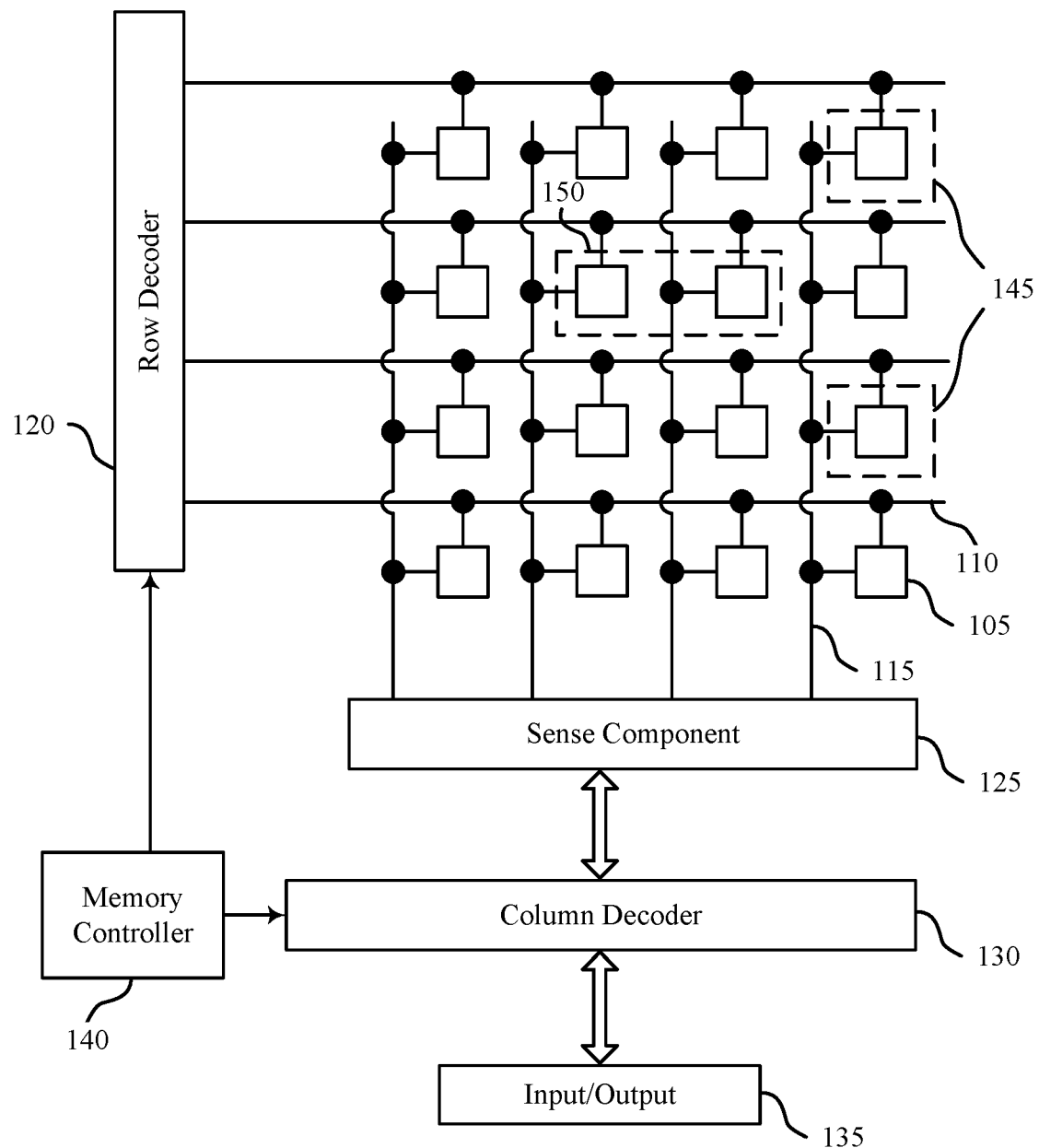
FIG. 1 illustrates an example memory array that supports cell-based reference voltage generation in accordance with various embodiments of the present disclosure.

A device-specific or array-specific reference voltage may be generated and maintained by using memory cells of the device. For example, the memory cells of an array may be set to alternating states to facilitate charge-sharing between the memory cell digit lines, providing a reference voltage midway between the alternating states.

Memory cells, including ferroelectric memory cells, within a memory array may be accessed by a word line and a digit line. Access includes writing to a cell (e.g., storing a logic state) or reading a cell (e.g., reading a stored logic state). Each cell may have a storage component, for example a ferroelectric capacitor, that is used to store a logic value of the cell. For example, each cell may store either a logic 0 or a logic 1. Each stored logic value may correspond to a respective state of the cell and may produce a signal on a digit line of the cell. For example, a stored logic 1 may correspond to a first digit line voltage and a stored logic 0 may correspond to a second digit line voltage. The digit line may connect multiple memory cells and may be connected to a sense amplifier that, when activated during a read operation, is used to determine the stored logic state of a memory cell. For example, an activated sense amplifier may compare the signal (e.g., voltage) extracted from the cell to a reference signal.

The reference signal may be a voltage that has a value halfway (or nearly halfway) between the respective digit line voltages for a logic 0 and a logic 1. But the digit line voltages for each cell state (e.g., stored logic 1 or logic 0) may vary from device to device. So there may be a discrepancy between a predetermined (e.g., factory-set) voltage reference and a more accurate reference voltage for an array. Additionally, the reference voltage for an array may fluctuate over time due to variations in cell use and cell characteristics. Thus, an array may use a set of cells in its memory array to dynamically generate and maintain a reference voltage that is specific to the device and/or the operating conditions.

As described herein, cells from a ferroelectric memory array may be initialized to alternating states. For example, alternating cells may be used to store logic 1s and logic 0s. The cells may be accessed so that digit lines of the cells charge to voltages that correspond to each respective stored state. The digit lines may then be shorted together, allowing charge-sharing between digit lines to occur. The charge-sharing may result in a voltage with a value midway between the digit line voltages corresponding to each stored state. This voltage may be processed by the device (e.g., in a memory controller) and used as a reference voltage for other operations (e.g., sense operations) of the array.

Embodiments of the disclosure introduced above are further described below in the context of a memory array. Specific examples are then described for cell-based reference voltage generation. These and other embodiments of the disclosure are further illustrated by and described with reference to apparatus diagrams, system diagrams, and flowcharts that relate to cell-based reference voltage generation.

FIG. 1 illustrates an example memory array 100 that supports cell-based reference voltage generation in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, a memory cell 105 is configured to store more than two logic states. Each state may produce a corresponding voltage across a memory cell 105 when the memory cell 105 is accessed. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and some details and advantages of a ferroelectric memory cell 105 are discussed below.

Operations such as reading and writing may be performed on memory cells 105 by activating or selecting the appropriate word line 110 and digit line 115. Activating or selecting a word line 110 or a digit line 115 may include applying a voltage potential to the respective line. In some cases, a digit line 115 may be referred to as a bit line. Word lines 110 and digit lines 115 are made of conductive materials. In some examples, word lines 110 and digit lines 115 are made of elemental metals (e.g., copper, aluminum, gold, tungsten), an alloy of two or more elemental metals, a conductive metal compound, a conductively-doped semiconductor material, or mixtures thereof. Examples of materials may include TiN, TiCN, TiAlN, TiAlCN, Ru—TiN, and RuCN. According to the example of FIG. 1, each row of memory cells 105 are connected to a single word line 110, and each column of memory cells 105 are connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105. In other architectures, the logic storing device of a cell may be electrically isolated from the word line by a selection device, such as a transistor whose gate may be connected to the digit line.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. When a cell 105 is read, the stored state may produce a corresponding signal across a capacitor of the cell, and thus at the digit line 115. The sense component 125 may compare the signal (e.g., a voltage) of the relevant digit line 115 to a reference signal (not shown) in order to determine the stored state of the memory cell 105. The reference signal may have a value that is the average of the voltages produced by the two different logic states. If digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

Memory array 100 may use at least two memory cells 105 to produce a reference voltage that is midway between logic 1 and logic 0 digit line voltages. The memory cells may store opposite states and may be accessed in such a way that charge-sharing occurs between their respective digit lines 115 and a reference voltage is produced. The memory cells 105 used to generate the reference voltage may be configured so that logic states are stored irrespective of user inputs. That is, the stored logic 1s and 0s written to the memory cells may be unassociated with user data.

Although the memory cells 105 store states that are unassociated with user data (e.g., states that are not associated with meaningful information), the memory cells 105 may be selected via user inputs. That is, a user may select which memory cells 105 are used to generate the reference voltage. In other cases, the memory cells 105 are predetermined such that they are selected at power-up of the device hosting the memory array 100. In some cases, the memory cells 105 are edge memory cells (e.g., edge memory cells 145) whose digit lines would either be floating or hard-wired to a voltage source (e.g., VCC/2) in a conventional memory array 100 architecture (e.g., rather than connected to sense component 125). In other cases, the memory cells 105 may be a set of cells that are exclusive of edge cells (e.g., the memory cells 105 may be memory cells 105 that are internal to the edge cells, such as internal memory cells 150). Using the techniques described herein, a reference voltage may be generated using two memory cells 105. However, any even number of memory cells 105 may be used in the generation of the reference voltage. Memory cells 105 used to generate a reference voltage may be adjacent or separated from one another. In some cases, increasing the number of memory cells 105 used to produce the reference voltage may increase the accuracy and stability of the reference voltage.

Using the techniques described herein, a reference voltage may be generated using two memory cells 105. However, any number of memory cells 105 may be used in the generation of the reference voltage. The number of memory cells 105 may be even or odd. When the number of memory cells 105 is even, the resulting reference voltage may be the average of the voltage present on digit lines 115 (e.g., when two voltage values are used). When the number of memory cells 105 is odd, the resulting reference voltage may have a value that is closer to one of the voltages than the other (e.g., when two voltage values are used). For example, the reference voltage may be closer to a first voltage value provided by n memory cells 105 than a second voltage value provided by m memory cells 105, where n>m. Thus, the reference voltage may tailored to a voltage value that is different than the average of the voltages uses based on the relative weights of the voltages. In some cases, the reference voltage may be generated using more than two voltage values.

The generated reference voltage may be processed (e.g., converted from an analog signal to a digital signal) and stored before being used by other components of the device that hosts memory array 100. In some cases, the stored reference voltage may cease to be midway between the two respective digit line voltages due to changes in the use or condition of memory array 100. For example, while the stored reference voltage may remain constant, the digit line voltages may vary so that a voltage midway between the digit lines is no longer equal to the stored reference voltage. In such scenarios, the reference voltage may be refreshed or re-generated by performing the techniques described herein.

The re-generation of the reference voltage may be triggered by certain conditions detected by the memory controller 140 (or another component of memory array 100). For example, the reference voltage may be refreshed after memory array 100 has performed a threshold number of operations (e.g., read or write operations). Alternatively, the refresh may be triggered when a physical condition is experienced by the memory array 100 (e.g., when the memory array 100 reaches a threshold temperature). In some cases, the reference voltage may be refreshed periodically (e.g., at the expiry of a timer). In other cases, the reference voltage may be refreshed in response to an input of a user. In other embodiments, the reference voltage may be refreshed when an error correction criticality or event has been detected. For instance, if the number of errors detected (e.g., via error correction code (ECC)) is greater than a threshold number, the memory controller 140 may determine to update the reference voltage. The memory controller 140 may also update the reference voltage when the number of correctable errors reaches a maximum.

A memory cell 105 may be set, or written or initialized to a state, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

As described herein, ferroelectric memory cells 105 may be used to generate a reference voltage that is midway between logic 0 and logic 1 digit line voltages. The ferroelectric memory cells 105 may be placed in alternating states such that every other cell 105 stores a logic 1 or a logic 0. After storage of the states, the ferroelectric memory cells 105 may be read in such a way that the respective digit lines 115 charge-share. By exchanging electrons via charge-sharing, the digit lines 115 may reach an equilibrium voltage that is the average between the initial digit line 115 voltages. This equilibrium voltage may be used as a reference voltage by other components in the device that houses the memory array 100. Different reference voltage values may be generated by changing the configuration or pattern of states stored by the memory cells 105.

Figure 2:
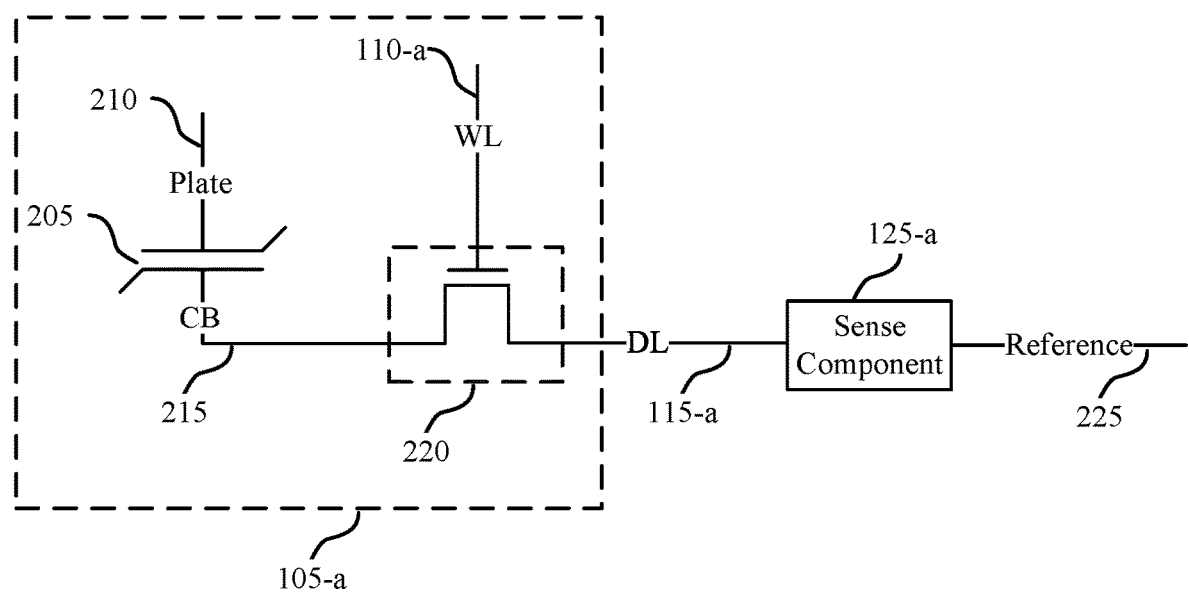
FIG. 2 illustrates an example circuit of a memory cell that supports cell-based reference voltage generation in accordance with various embodiments of the present disclosure.

FIG. 2 illustrates an example circuit 200 for cell-based reference voltage generation in accordance with various embodiments of the present disclosure. Circuit 200 includes a ferroelectric memory cell 105-a, word line 110-a, digit line 115-a, and sense component 125-a, which may be examples of a memory cell 105, word line 110, digit line 115, and sense component 125, respectively, as described with reference to FIG. 1. Circuit 200 may include a logic storage component, such as capacitor 205, which may include conductive terminals, including plate 210 and cell bottom 215. These terminals may be separated by an insulating ferroelectric material. As described above, various states may be stored by charging or discharging capacitor 205, i.e., polarizing the ferroelectric material of capacitor 205. The total charge needed to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 may be a transistor and its operation may be controlled by applying a voltage to the transistor gate, where the voltage magnitude is greater than the threshold magnitude of the transistor. Word line 110-a may activate selection component 220; for example, a voltage applied to word line 110-a may be applied to the transistor gate, connecting capacitor 205 with digit line 115-a.

In the example depicted in FIG. 2, capacitor 205 is a ferroelectric capacitor. Due to the ferroelectric material between the plates of capacitor 205, and as discussed in more detail below, capacitor 205 may not discharge upon connection to digit line 115-a. Instead, plate 210 may be biased by an external voltage, resulting in a change in the stored charge on capacitor 205. The change in stored charge depends on the initial state of capacitor 205, i.e., whether the initial state stored a logic 1 or a logic 0. The change in stored charge may then be compared to a reference 225 (e.g., a reference voltage) by sense component 125-a in order to determine the stored logic state in memory cell 105-a.

The specific sensing scheme or process may take many forms. In one example, digit line 115-a may have an intrinsic capacitance and develop a non-zero voltage as capacitor 205 charges or discharges in response to the voltage applied to plate 210. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of pF). The subsequent voltage of digit line 115-a may depend on the initial logic state of capacitor 205, and sense component 125-a may compare this voltage to a reference voltage generated by other memory cells 105. For example, a voltage may be applied to plate 210 and a voltage at capacitor bottom 215 may change in relation to the stored charge. The voltage at capacitor bottom 215 may be compared with a reference voltage at sense component 125-a, and a comparison to the reference voltage may indicate a change in the charge of capacitor 205 resulting from the applied voltage and thus indicate a logic state stored in memory cell 105-a. The relationship between charge and voltage in capacitor 205 is described in further detail with reference to FIG. 3.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of plate 210 and cell bottom 215 through digit line 115-a. To write a logic 0, plate 210 may be taken high, that is, a positive voltage may be applied, and cell bottom 215 may be taken low—i.e., connected to ground, virtually grounded, or negative voltage may be applied. The opposite process is performed to write a logic 1—i.e., plate 210 is taken low and cell bottom 215 is taken high.

Figure 3:
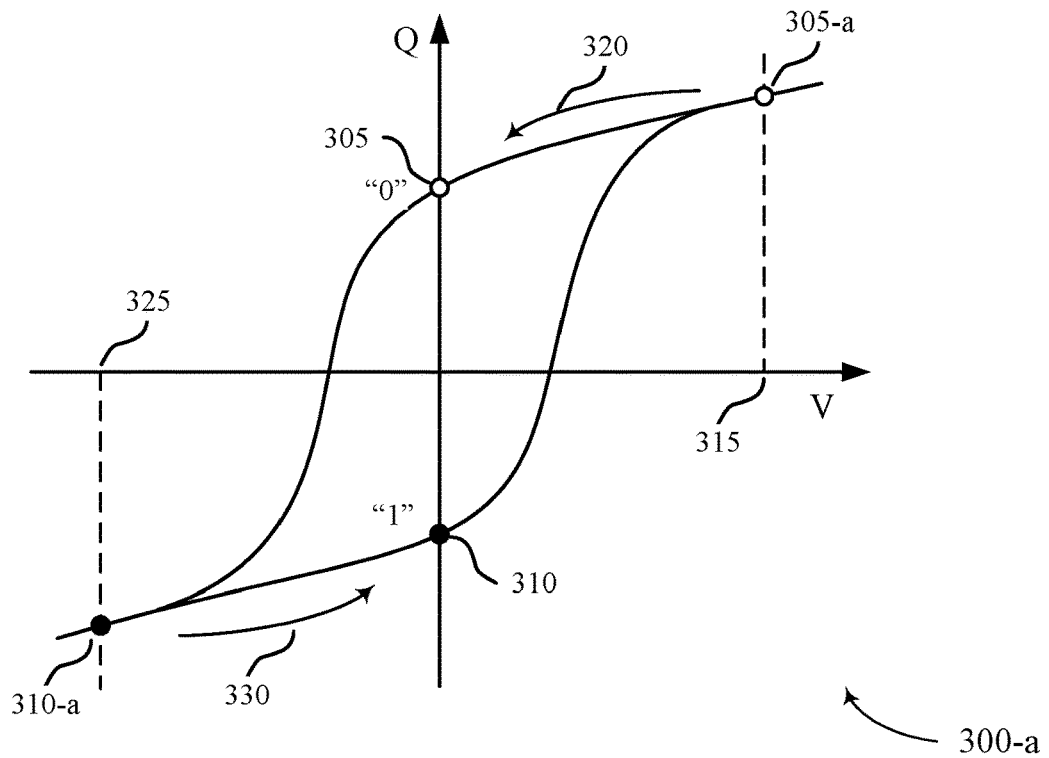
FIG. 3 illustrates example hysteresis plots for operating a ferroelectric memory cell that supports cell-based reference voltage generation in accordance with various embodiments of the present disclosure.
Figure 3:
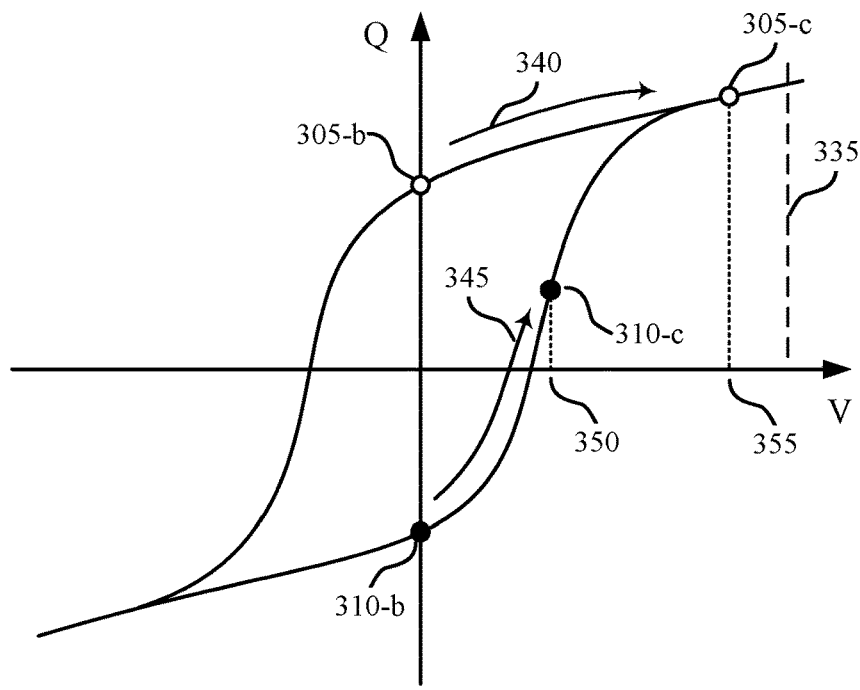

Read and write operations of capacitor 205 may account for the non-linear properties associated with a ferroelectric device. FIG. 3 illustrates examples of such non-linear properties with hysteresis curves 300-a and 300-b for a ferroelectric memory cell that supports cell-based reference voltage generation in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitors 205 of FIG. 2) as a function of a voltage, V.

A ferroelectric material is characterized by a spontaneous electric polarization—i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal.

Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-b or 310-b was initially stored. For example, hysteresis curve 300-b illustrates two possible stored charge states 305-b and 310-b. Net voltage 335 may be applied across the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis, i.e., charge states 305-c and 310-c may be defined with respect to the digit line capacitance. As a result, the voltage of the capacitor, voltage 350 or voltage 355, may be different and may depend on the initial state of the capacitor.

By using the voltage of the capacitor (e.g., voltage 350 or voltage 355) in a comparison to a reference voltage, the initial state of the capacitor may be determined. For example, the reference voltage may be an average of the sum of the applied voltage 335 and voltage 350 and the sum of the applied voltage 335 and voltage 355. Upon comparison, the sensed voltage (e.g., the sum of the applied voltage 335 and voltage 350, or the sum of the applied voltage 335 and voltage 355) may be determined to be higher or lower than the reference voltage. A value of the ferroelectric cell (i.e., a logic 0 or 1) may then be determined based on the comparison.

The value of the reference voltage may affect the accuracy of a read operation. For example, if the value if too high, a logic state 1 may be misread as a logic state 0. If the reference voltage value is too low, a logic state 0 may be misread as a logic state 1. Thus, a reference voltage that is midway between two different logic states may be used. Such a reference voltage may be generated using the techniques described herein. Because these techniques use memory cells 105, in some cases, any variation in memory array 100 characteristics will be reflected in the generated reference voltage; thus, the value of this voltage relative to the digit lines may be maintained irrespective of changes to the memory array 100.

As discussed above, reading a memory cell 105 may degrade or destroy the stored logic state or value. But a ferroelectric memory cell 105 may maintain the initial logic state after a read operation. For example, if charge state 305-b is stored and the read operation performed, the charge state may return to initial charge state 305-b after voltage 335 is removed, for example, by following path 340 in the opposite direction.

Figure 4:
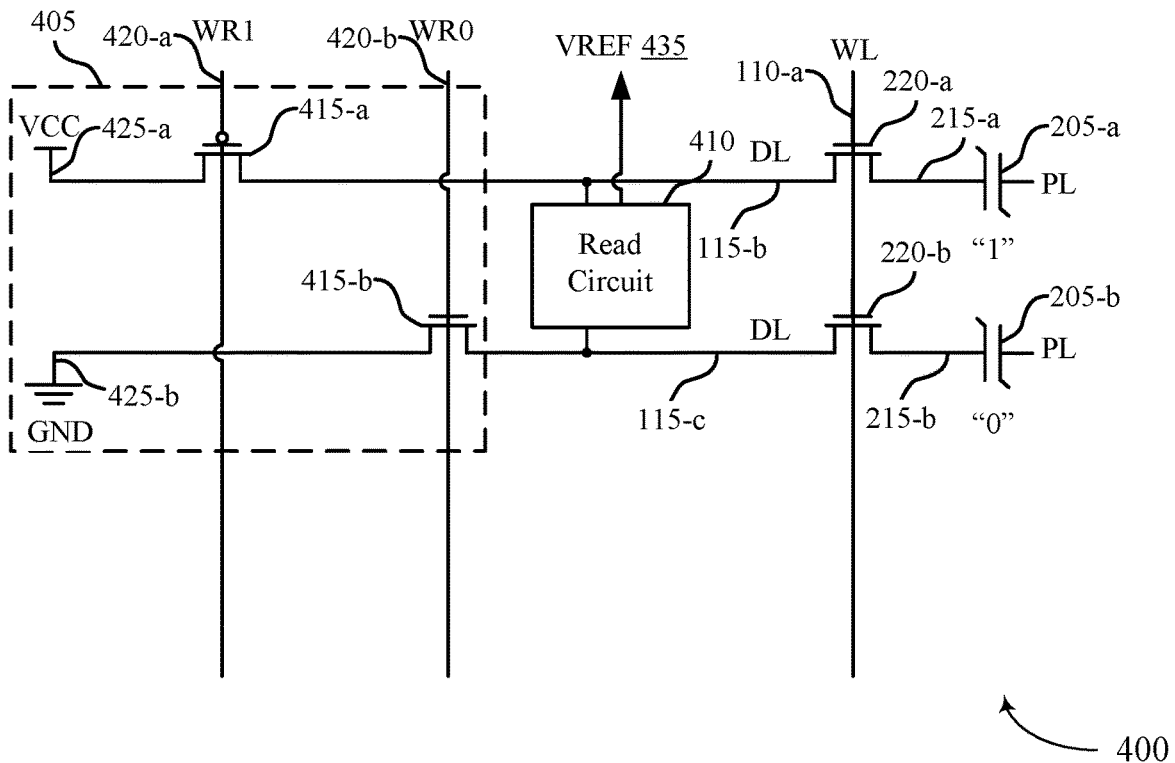
FIG. 4 illustrates an example circuit that supports cell-based reference voltage generation in accordance with various embodiments of the present disclosure.

FIG. 4 illustrates an example circuit 400 for cell-based voltage reference generation in accordance with various embodiments of the present disclosure. Circuit 400 may output a reference voltage VREF 435 that is created from charge-sharing between two digit lines 115. Each capacitor 205 and selection component 220 pair shown in circuit 400 may be an example of a cell 105 described with reference to FIG. 2. Although only two cells 105 are shown, the techniques describe herein may be implemented using any number of cells 105. Using more cells 105 may decrease susceptibility to noise, which in turn may increase the accuracy of the generated reference voltage. Circuit 400 may include cells 105 at the edge of an electronic memory array (e.g., a ferroelectric memory array 100) or internal to the edge of the array (e.g., the cells of example circuit 400 be exclusive of edge cells).

Circuit 400 may include capacitor 205-a and capacitor 205-b, which may be examples of a ferroelectric capacitor 205 described with reference to FIG. 2. Capacitor 205-a may be in electronic communication with selection component 220-a so that activation of selection component 220-a connects cell bottom 215-a to digit line (DL) 115-b and deactivation of selection component 220-a isolates cell bottom 215-a from digit line 115-b. Similarly, capacitor 205-b may be in electronic communication with selection component 220-b such that activation of selection component 220-b connects cell bottom 215-b to digit line 115-c and deactivation of selection component 220-a isolates cell bottom 215-b from digit line 115-c. The selection components 220 may be activated by applying an activation voltage to the word line 110-a. Each of the capacitors 205 may be in electronic communication with a write circuit 405 and a read circuit 410.

Write circuit 405 may include a number of switching components 415, such as switching component 415-a and switching component 415-b. When activated, a switching component 415 may enable the flow of electrons between two components; when deactivated, the switching component 415 may prevent the flow of electrons between the two components. In the example depicted in FIG. 4, the switching components 415 are transistors (e.g., switching component 415-a is a PMOS transistor and switching component 415-b is an NMOS transistor); however, other devices may be used. Accordingly, switching component 415-a may be activated by applying a voltage (e.g., a ground reference voltage) to the gate of switching component 415-a (e.g., via write line WR1 420-a) and switching component 415-b may be activated by applying a voltage (e.g., a positive voltage) to the gate of switching component 415-b (e.g., via write line WR0 420-b). The voltage applied at write line WR1 420-a and write line WR0 420-b may satisfy the threshold voltage requirements to turn the respective switching components 415 on and may be referred to as a write voltages or activation voltages. In some cases, a controller may coordinate the application of voltages to the write lines 420.

Write circuit 405 may also include a number of voltage sources 425, such as voltage source 425-a and voltage source 425-b. In the example depicted in FIG. 4, voltage source 425-a may be a positive rail voltage VCC and voltage source 425-b may be a virtual ground reference GND. Switching component 415-a may be connected to voltage source 425-a and switching component 415-b may be connected to voltage source 425-b. The connections between the switching components 415 and the voltage sources 425 may be indirect or direct (e.g., hard-wired). Thus, when switching component 415-a is activated (e.g., by applying an activation voltage to write line WR1 420-a), the voltage of digit line 115-b may change to be that of voltage source 425-a. That is, the voltage at digit line 115-b may become VCC. When switching component 415-b is activated (e.g., by applying an activation voltage to write line WR0 420-b), the voltage of digit line 115-c may change to be that of voltage source 425-a. That is, the voltage at digit line 115-c may become 0V. In the example depicted in FIG. 4, voltage source 425-a is VCC and voltage source 425-b is ground (GND); however, voltage sources 425 with different values may be used. In some examples, the voltage sources 425 are external to write circuit 405.

Capacitor 205-a may be initialized to a first state and capacitor 205-b may be initialized a second state by activating write circuit 405. Each state may be associated with a voltage across the corresponding capacitor 205. In some cases, the first state is equivalent to storing a logic 1 and the second state is equivalent to storing a logic 0. Thus, when the cells 105 are read, digit line 115-b may have a first voltage (corresponding to a stored logic 1) and digit line 115-c may have a second voltage (corresponding to a stored logic 0). These voltages may be used to generate a reference voltage that is midway between the two digit line voltages. For example, read circuit 410 may short digit line 115-b and digit line 115-c together so that charge-sharing occurs. Digit line 115-b and digit line 115-c may exchange electrons until an equilibrium voltage is reached. The voltage that results from charge-sharing between the digit lines 115 may be output from the read circuit 410 and used as a reference voltage for other components of the device that contains circuit 400. In some cases, a controller coordinates the operation of circuit 400.

Figure 5:
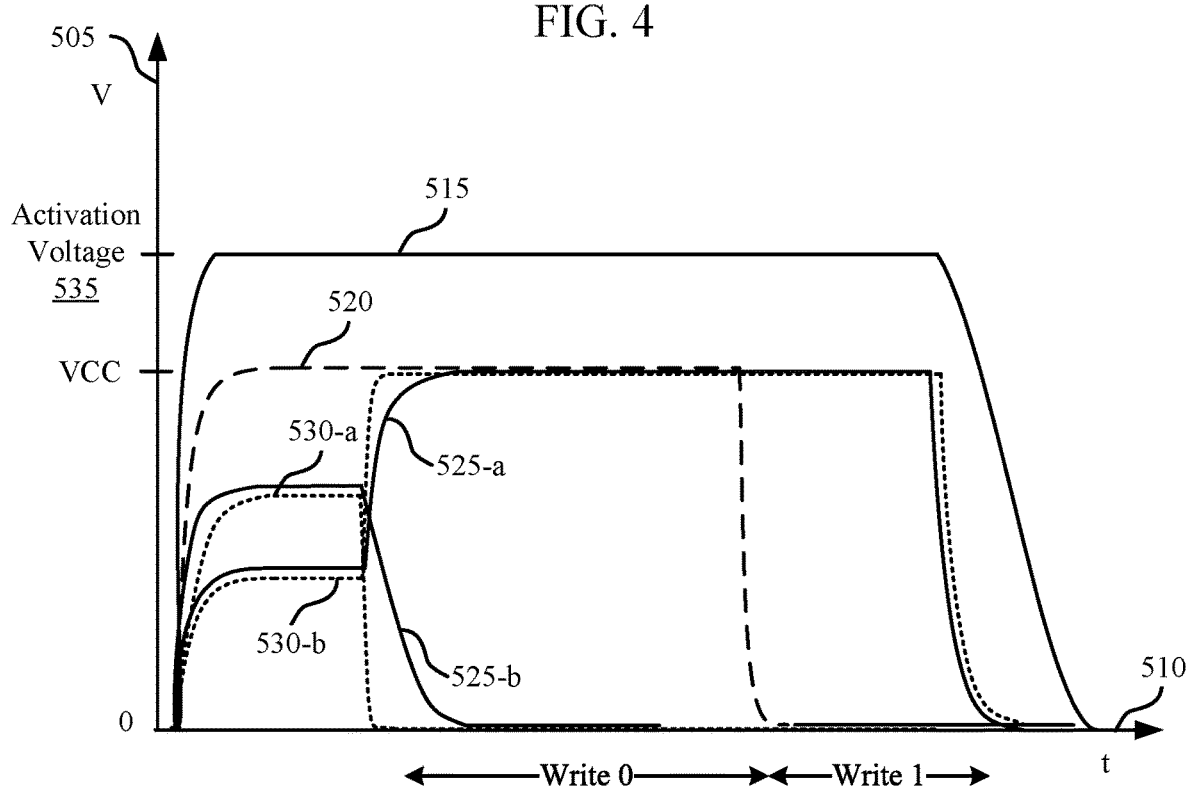
FIG. 5 illustrates an example timing diagram that supports cell-based reference voltage generation in accordance with various embodiments of the present disclosure.

FIG. 5 illustrates an example of a timing diagram 500 for operating a ferroelectric memory cell array that supports cell-based reference voltage generation in accordance with various embodiments of the present disclosure. Timing diagram 500 includes voltage represented on axis 505 and time represented on axis 510, and timing diagram 500 depicts an exemplary write operation of circuit 400. The write operation may initialize the capacitors 205 to alternating states. The voltages of various components of circuit 400 are also represented as a function of time on timing diagram 500. For example, timing diagram 500 includes word line voltage 515, plate voltage 520, write line voltage 525-a, write line voltage 525-b, digit line voltage 530-a, and digit line voltage 530-b.

Word line voltage 515 may be applied to selection component 220-a and selection component 220-b such that the selection components 220 are activated and the capacitors 205 are selected (e.g., word line voltage 515 may be increased to the activation voltage 535). Thus, the digit lines 115 may be connected to their respective cell bottoms 215. Before the application of word line voltage 515, the switching components 415 are inactive. After the application of word line voltage 515, plate voltage 520 may be applied to the plate of each capacitor 205. Also, the write line voltages 525 may be applied so that the switching components 415 are activated. Activating switching component 415-b allows the voltage of voltage source 425-b to be applied at digit line 115-c so that digit line voltage 530-a is pulled to ground. By way of example, when selection component 220-b is activated, the voltage seen at cell bottom 215-b is that of digit line voltage 530-a. Accordingly, when write line voltage 525-a is applied, the digit line voltage 530-a becomes 0V. The voltage across capacitor 205-a is effectively the difference between plate voltage 520 and digit line voltage 530-a. Because the plate voltage 520 is high and the digit line voltage 530-a is low, a positive voltage is applied across capacitor 205-b, which, according to the hysteresis of capacitor 205-b, results in the generation of a charge state corresponding to a logic 0.

To store a logic 1 at capacitor 205-a, plate voltage 520 may be reduced to a threshold value (e.g., ground). The activation of switching component 415-a, which occurs when write line voltage 525-b is applied, allows the voltage of voltage source 425-a to be applied at digit line 115-b such that digit line voltage 530-b is pulled high (e.g., to VCC). Because selection component 220-a is activated, the voltage seen at cell bottom 215-a is that seen by digit line 115-b (e.g., digit line voltage 530-b). Thus, the voltage across capacitor 205-a is effectively the difference between plate voltage 520 and digit line voltage 530-b. Because the plate voltage 520 is low (e.g., grounded) and the digit line voltage 530-b is high, a negative voltage is applied across capacitor 205-a, which, according to the hysteresis of capacitor 205-a, results in the generation of a charge state corresponding to a logic 1.

When plate voltage 520 is reduced to ground, the voltage across capacitor 205-b becomes zero and the logic 0 is stored. Similarly, when digit line voltage 530-b is reduced to ground (e.g., by reducing write line voltage 525-a and inactivating switching component 415-a), the voltage across capacitor 205-a becomes zero and the logic 1 is stored. Thus, capacitors 205 may be initialized to altering logic states. These logic states may be used during a read operation to generate a reference voltage (e.g., by activating read circuit 410).

Figure 6:
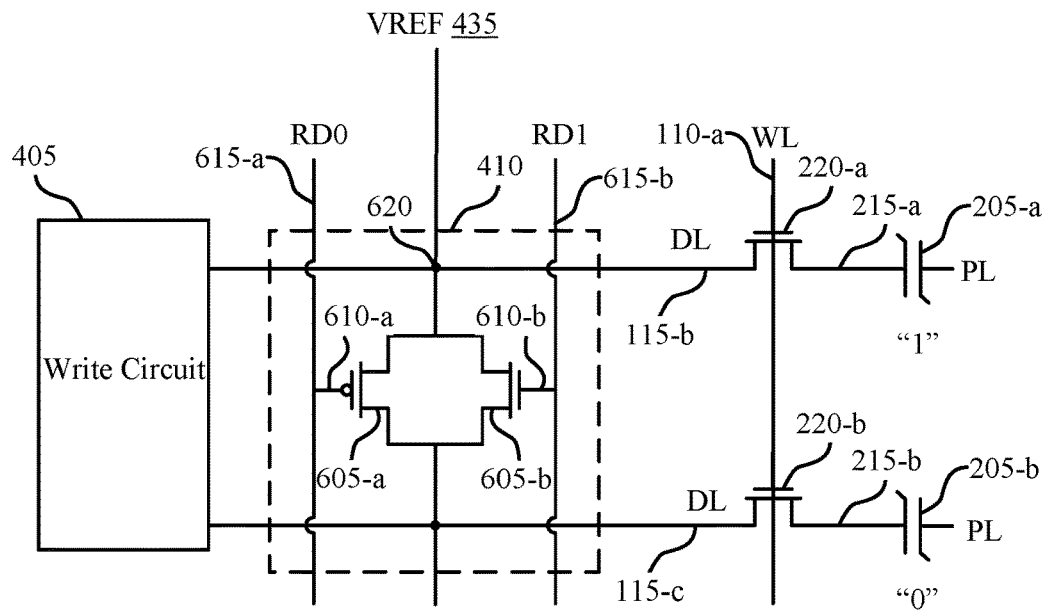
FIG. 6 illustrates an example circuit that supports cell-based reference voltage generation in accordance with various embodiments of the present disclosure.

FIG. 6 illustrates an example circuit 600 for cell-based voltage reference generation in accordance with various embodiments of the present disclosure. Circuit 600 may be an example of circuit 400. The capacitors 205 of circuit 600 may be initialized to alternating states as described with reference to FIG. 5. For example, capacitor 205-a may store a logic 1 and capacitor 205-b may store logic 0. Write circuit 405 may be an example of write circuit 405 as described with reference to FIG. 4. Alternatively, write circuit 405 may be realized using a different configuration of components capable of performing the same operations as write circuit 405.

Read circuit 410 may include switching component 605-a and switching component 605-b. Each switching component 605 may be in electronic communication with the selection components 220, capacitors 205, and write circuit 405. In the example of FIG. 6, the switching components 605 are transistors (e.g., switching component 605-a may be a PMOS transistor and switching component 605-b may be an NMOS transistor); however, other devices may be used. Accordingly, switching component 605-a may be activated by applying a voltage to the gate 610-a of switching component 605-a (e.g., via read line RD0 615-a) and switching component 605-b may be activated by applying a voltage to the gate 610-b of switching component 605-b (e.g., via read line RD1 615-b). The voltage applied at read line RD0 615-a and read line RD1 615-b may be referred to as a read voltage or activation voltage. In some cases, a controller may coordinate the application of voltage to the read lines 615.

Activation the switching components 605 may effectively short digit line 115-b and digit line 115-c. That is, activating the switching components 605 may allow an exchange of electrons between the two digit lines 115. When the digit lines 115 have different voltages, the electrons may flow between the two digit lines 115 until an equilibrium state is reached in which the voltage at common node 620 is midway between the respective voltages of the digit lines 115. A common node may refer to a physical junction between two components at which a single voltage may be measured. Thus, activation of read circuit may 410 may generate a reference voltage VREF 435 that is a function of—and therefore varies with—cell characteristics. In some cases, a controller may coordinate the operation of circuit 600.

Thus, circuit 600 is an example of an electronic memory array that includes a first ferroelectric cell 205-a which is in electronic communication with a first voltage source 425-a and a second ferroelectric cell 205-b which is in electronic communication with a second voltage source 425-b. In the example depicted in FIG. 4, the first voltage source 425-a is a positive voltage source and the second voltage source 425-b is a ground reference. Circuit 400 also includes a first switching component (e.g., a switching component 605 or read circuit 410) in electronic communication with a first digit line 115-b of the first ferroelectric cell 205-a and second digit line 115-c of the second ferroelectric cell 205-b. The circuit 600 may also include a second switching component 415-a that is in electronic communication with the first ferroelectric capacitor 205-a and a third switching component 415-b that is in electronic communication with the second ferroelectric capacitor 205-b. The second switching component 415-a may be hard-wired to the first voltage source 425-a and the third switching component may be hard-wired to the second voltage source 425-b.

Figure 7:
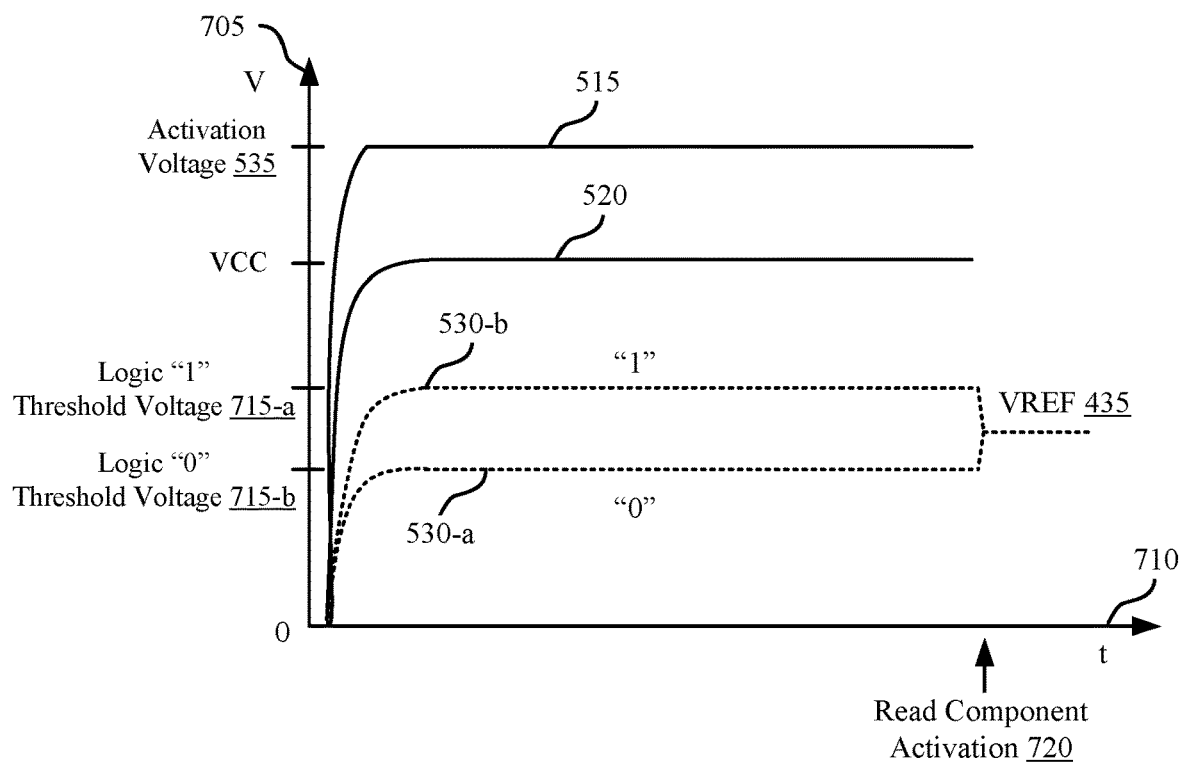
FIG. 7 illustrates an example timing diagram that supports cell-based reference voltage generation in accordance with various embodiments of the present disclosure.

FIG. 7 illustrates an example of a timing diagram 700 for operating a ferroelectric memory cell array that supports cell-based reference voltage generation in accordance with various embodiments of the present disclosure. Timing diagram 700 includes voltage on axis 705 and time on axis 710 and may represent a read operation of circuit 600. The read operation may produce a reference voltage VREF 435 using the digit line voltages for cells that are initialized to different states. The voltages of various components of circuit 600 are also represented as a function of time on timing diagram 700. For example, timing diagram 700 includes word line voltage 515, plate voltage 520, digit line voltage 530-a, and digit line voltage 530-b. Timing diagram 700 may represent events that occur after events depicted by timing diagram 500. Thus, timing diagram 700 may be implemented after capacitor 205-a has stored a logic 1 and capacitor 205-b has stored a logic 0.

To generate the reference voltage VREF 435, word line voltage 515 may be increased to a threshold value (e.g., activation voltage 535) such that the selection components 220 are activated. Activating the selection components 220 connects the cell bottoms 215 to their respective digit lines 115. Plate voltage 520 is applied to the plate of each capacitor 205 so that respective charge states of the capacitors 205 move to their final position, as described with reference to FIG. 3. Plate voltage 520 may be applied based at least in part on a periodic timing schedule or on a temperature change of the array that includes circuit 600. Thus, a first voltage (e.g., digit line voltage 530-b) may be developed on digit line 115-b of capacitor 205-a which corresponds to the stored logic 1 and a second voltage (e.g., digit line voltage 530-a) may be developed on digit line 115-c of capacitor 205-b which corresponds to a stored logic 0. The digit line voltages 530 may develop based at least in part on the application of plate voltage 520. The cell bottom 215 for each capacitor 205 may track the plate voltage 520 minus the voltage across the respective capacitor 205. Because the digit lines 115 are connected to the cell bottoms 215 via selection components 220, digit line voltage 530-a may reach threshold voltage 715-b and digit line voltage 530-b may reach threshold voltage 715-a.

After the digit lines voltages 530 have stabilized, read circuit 410 may be activated (e.g., read circuit activation 720 may occur). In the example of FIG. 7, activation of read circuit 410 may include applying activation voltages to read line RD0 615-a and read line RD1 615-b. Thus, digit line 115-b may be connected (e.g., shorted) to digit line 115-c. This connection may enable charge-sharing between the digit lines 115 until an equilibrium charge state is reached. That is, the digit lines 115 may exchange electrons until a single voltage (e.g., reference voltage VREF 435) is reached at the common node 620 shared between the digit lines 115. Thus, reference voltage 435 may be generated from the voltage developed on digit line 115-b (e.g., digit line voltage 530-b) and the voltage developed on digit line 115-c (e.g., digit line voltage 530-a). The reference voltage VREF 435 may be midway (or nearly midway) between threshold voltage 715-a and threshold voltage 715-b; that is, the reference voltage VREF 435 may be between the digit line voltages 530. In some cases, the reference voltage may be an average of the digit line voltages 530. Thus, a cell-based reference voltage may be generated. In some cases the reference voltage VREF 435 may be passed on to an analog-to-digit converter before being stored (e.g., saved) or used by other components (e.g., sense component 125). The reference voltage may be stored (e.g., for a period of time) in digit or analog form.

Figure 8:
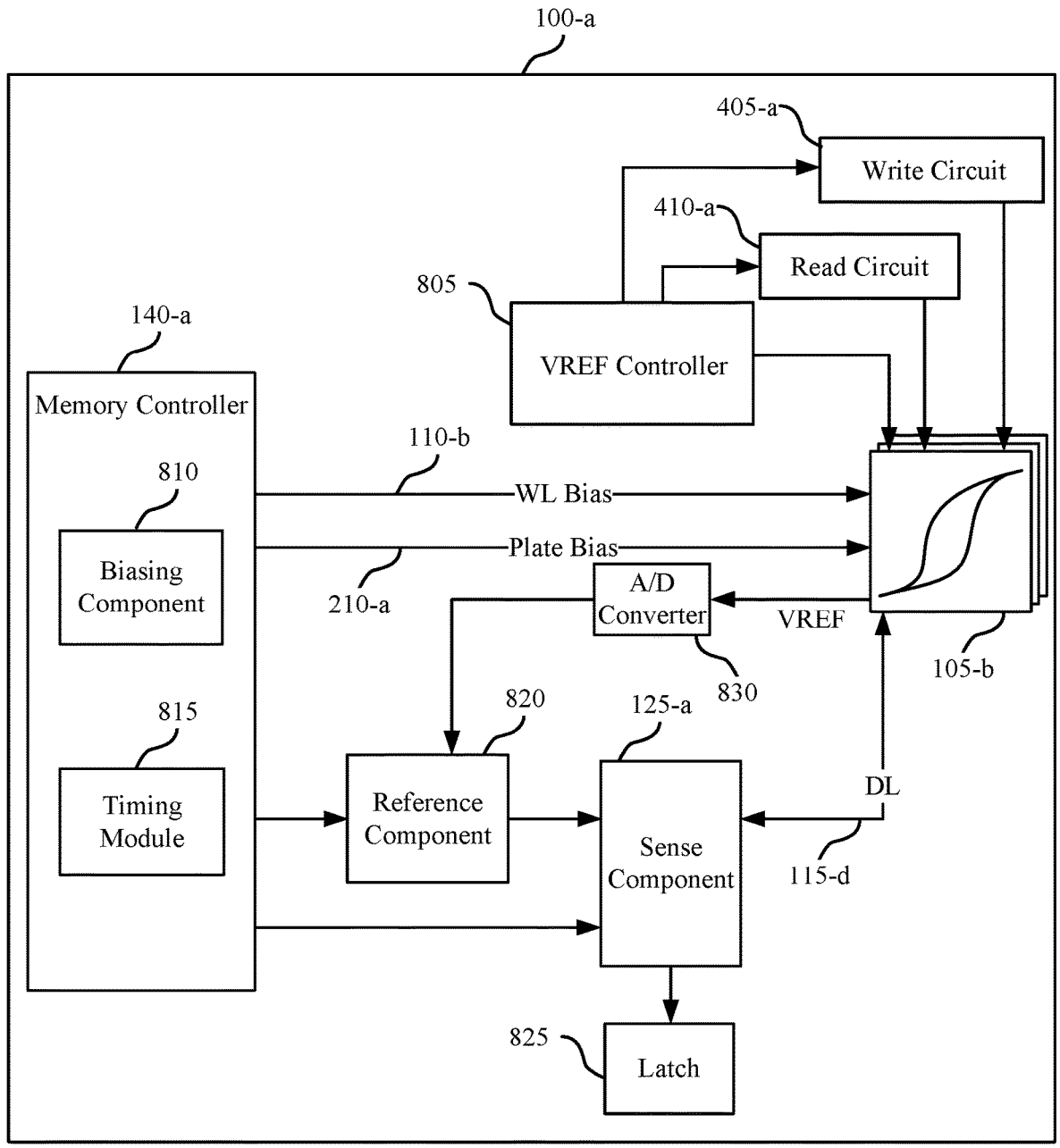
FIG. 8 illustrates an example ferroelectric memory array that supports cell-based reference voltage generation in accordance with various embodiments of the present disclosure.

FIG. 8 shows a block diagram 800 of a memory array 100-a that supports cell-based reference voltage generation in accordance with various embodiments of the present disclosure. In some cases, memory array 100-a may be referred to as an electronic memory apparatus. Memory array 100-a may contain memory controller 140-a and memory cells 105-b, which may be examples of memory controller 140 and memory cells 105 described with reference to FIGS. 1 and 2. Memory array 100-a may include a write circuit 405-a and a read circuit 410-a, which may be examples of a write circuit 405 and a read circuit 410 described with reference to FIGS. 4 and 6. The VREF controller 805 may be in electronic communication with (and control the operations of) write circuit 405-*a* and read circuit 410-*a*. In some cases, VREF controller 805 may also control certain operations of memory array 100-*a*. Although shown separate from memory controller 140-*a*, VREF controller 805 may be integrated or co-located with memory controller 140-*a*.

Memory cells 105-*b* includes a number of memory cells 105, some or all of which are used to generate a cell-based reference voltage. For example, and as described with reference to FIGS. 2 and 4, memory cells 105-*b* may include a first ferroelectric memory cell and a second ferroelectric memory cell. The first ferroelectric memory cell may be in electronic communication with a first voltage source (e.g., a positive voltage source such VCC) and include a first ferroelectric capacitor and a first selection component. The second ferroelectric memory cell may be in electronic communication with a second voltage source (e.g., a ground reference) and include a second ferroelectric capacitor and a second selection component.

The memory cells 105-*b* may be located at the edge of memory array 100-*a* or an internal portion of memory array 100-*a*. In some examples, the respective digit lines (not shown) of the cells 105-*b* are in electronic communication with write circuit 405-*a* and read circuit 410-*a*. In some examples, a first switching component of write circuit 405-*a* may be connected to the first voltage source and a second switching component of write circuit 405-*a* may be connected to the second voltage source. The connections between the switching components and the voltage sources may be indirect or direct (e.g., hard-wired). The first switching components may be in electronic communication with the first ferroelectric capacitor and the second switching component may be in electronic communication with the second ferroelectric capacitor.

The VREF controller 805 may be in electronic communication with selection components and may be operable to activate the first selection component and the second selection component. The VREF controller 805 may also determine a first voltage of the first ferroelectric capacitor (e.g., a logic 1 voltage) and a second voltage of the second ferroelectric capacitor (e.g., a logic 0 voltage). The determination may be based at least in part on the activation of the first and second selection components. The VREF controller 805 may generate a reference voltage from developed first voltage and the developed second voltage. The reference voltage may have a value between the developed first voltage and the developed second voltage.

In some cases, the VREF controller 805 may be operable to detect a condition for triggering activation of the first selection component and the second selection component. Thus, activation of the selection components may be based at least in part on a detected trigger condition. In some cases, the trigger condition is a temperature change (e.g., a temperature change of the memory array 100-*a* or a particular component of memory array 100-*a*). In other examples, the trigger condition is a timer expiration. In some cases, the trigger condition may be when an operation threshold is exceeded. For example, the selection components may be selected after a threshold number of read operations have occurred for other cells 105 of memory array 100-*a*. In some cases, the selection components may be selected upon detection that ECC is unable to correct a detected error, or upon determining that the number of detected errors exceeds a threshold. The activation of the selection components may start the write and read operations described with reference to FIGS. 5 and 7, which may refresh the value of the reference voltage VREF.

In some cases, the VREF controller 805 is in electronic communication with a first switching component and a second switching component of read circuit 410-*a*. The VREF controller 805 may activate the switching components so that charge-sharing occurs between the two digit lines 115 of the selection components that are in electronic communication with the switching components. The charge-sharing may result in, or generate, a reference voltage; thus, the reference voltage may be stored based at least in part on the activation of the first and second switching components. In some cases, the reference voltage may be passed on to an analog-to-digital (A/D) converter 830 before being stored (e.g., saved) or used by another component of memory array 100-*a*. The output of the A/D converter 830 may be passed to reference component 820 to be used as a reference for sense component 125-*a*. In some cases, the reference voltage may be stored, or used, in its analog form.

Memory controller 140-*a* may include biasing component 810 and timing module 815 and may operate memory array 100-*a* as described in FIGS. 1-7. Memory controller 140-*a* may be in electronic communication with word line 110-*b*, digit line 115-*d*, sense component 125-*a*, and plate 210-*a*, which may be examples of word line 110, digit line 115, sense component 125, and plate 210 described with reference to FIG. 1 or 2. Memory array 100-*a* may also include reference component 820 and latch 825. The components of memory array 100-*a* may be in electronic communication with each other and may perform the functions described with reference to FIGS. 1-7. In some cases, reference component 820, sense component 125-*a* and latch 825 may be components of memory controller 140-*a*.

Memory controller 140-*a* may be configured to activate word line 110-*b*, plate 210-*a*, or digit line 115-*d* by applying voltages (e.g., activation voltages) to those various nodes. For example, biasing component 810 may be configured to apply a voltage to operate memory cells 105-*b* to read or write memory cells 105-*b* as described above. In some cases, memory controller 140-*b* may include a row decoder, column decoder, or both, as described with reference to FIG. 1. This may enable memory controller 140-*a* to access one or more memory cells 105. Biasing component 810 may provide voltages for the operation of sense component 125-*a*.

In some cases, memory controller 140-*a* may perform its operations using timing module 815. For example, timing module 815 may control the timing of the various word line selections or plate biasing, including timing for switching and voltage application to perform the memory functions, such as reading and writing, discussed herein. In some cases, timing module 815 may control the operations of biasing component 810.

In some examples, some or all of the responsibilities of biasing component 810 and timing module 815 may be performed by VREF controller 805. For example, VREF controller 805 may be responsible for the timing and application of biasing voltages used for write circuit 405-*a*, read circuit 410-*a*, and memory cells 105-*b*. VREF controller 805 may facilitate the application of a first voltage to a first ferroelectric capacitor of the memory array 100-*a* and a second voltage to a second capacitor of the memory array 100-*a*. In some cases, the reference component 820 may store a reference voltage that is generated from a first voltage developed on a digit line of a first ferroelectric capacitor and a second voltage developed on a digit line of a second ferroelectric capacitor. The value of the reference voltage may be between the voltages developed on the digit lines of the two ferroelectric capacitors. For instance, the value of the reference voltage may be an average of the first voltage and the second voltage. In some cases, the reference voltage is converted from an analog signal to a digital signal.

In some examples, the VREF controller 805 may activate a first switching component that is in electronic communication with the first ferroelectric capacitor. The VREF controller 805 may also activating a second switching component that is in electronic communication with the second ferroelectric capacitor. In such cases, the first voltage may be applied to the first ferroelectric capacitor and the second voltage may be applied to the second ferroelectric capacitor based at least in part on activating the first switching component and the second switching component. The VREF controller 805 may also activate one or more additional switching components that are in electronic communication with the first digit line and the second digit line. In such cases, the reference voltage is detected based at least in part on activating the one or more additional switching components.

In some examples, the VREF controller 805 may activate a first selection component that is in electronic communication with the first ferroelectric capacitor to select the first ferroelectric capacitor. The VREF controller 805 may also activate a second selection component that is in electronic communication with the second ferroelectric capacitor to select the second ferroelectric capacitor. In some cases, the first ferroelectric capacitor and the second ferroelectric capacitor are selected based at least in part on a power-up operation of the memory array 100. That is, the cells 105 which are used to generate the voltage reference may be predetermined. In other cases, the first ferroelectric capacitor and the second ferroelectric capacitor are selected in response to a user input. That is, the user may choose which cells 105 are used to generate the voltage reference.

The reference voltage may deteriorate after a duration of time or after a number of operations (e.g., read operations of other cells 105 in memory array 100-a). Therefore, the reference voltage may be refreshed by repeating the read and write operations described with reference to FIGS. 5 and 7. Accordingly, the VREF controller may re-apply the first voltage to the first ferroelectric capacitor and the second voltage to the second ferroelectric capacitor. This re-application may restore a first state (e.g., logic 1) of the first ferroelectric capacitor and a second state (e.g., logic 0) of the second ferroelectric capacitor. In some examples, the re-application may be based at least in part on a periodic timing schedule. In other cases, the re-application may be based at least in part on a temperature change of the array to restore a first state of the first ferroelectric capacitor and a second state of the second ferroelectric capacitor.

In some cases, the VREF controller 805 may apply a first supply voltage to a first ferroelectric capacitor of the memory array 100-a. The VREF controller 805 may also apply a first write voltage to a first switching component that is in electronic communication with a first selection component. The first supply voltage may thus be applied based at least in part on applying the first write voltage. The VREF controller 805 may apply a second supply voltage to a second ferroelectric capacitor of the memory array 100-a. The second supply voltage may be different from the first supply voltage. In some cases, the VREF controller 805 applies a second write voltage to a second switching component that is in electron communication with a second selection component. In such cases, the second supply voltage is applied based at least in part on applying the second write voltage.

The VREF controller 805 may determine a reference voltage at a common node of the first selection component and the second selection component. The first selection component may be in electronic communication with the first ferroelectric capacitor and the second selection component may be in electronic communication with the second ferroelectric capacitor. The VREF controller 805 may use the reference voltage at the common node as a reference for an operation of the memory array 100-a. In some cases, the VREF controller 805 applies an activation voltage to one or more switching components that are in electronic communication with a first digit line 115 of the first selection component and a second digit line 115 of the second selection component. This application may enable charge-sharing between the two digit lines 115; thus, determining the reference voltage at the common node may be based at least in part on the application of the activation voltage.

As described above, the VREF controller 805 may control certain operations of memory array 100-a. For example, the VREF controller 805 may coordinate the application of activation voltages to write circuit 405-a, read circuit 410-a, and memory cells 105-b. The application of activation voltages may enable the read and write operations described with reference to FIGS. 5 and 7. The VREF controller 805 may facilitate some or all steps of these operations by communicating with other components which apply the activation voltages. Alternatively, the VREF controller 805 may itself perform the application of the activation voltages. In some cases, the VREF controller 805, in combination with memory controller 140-a, implements the operations described herein. Thus, in certain examples, the operations described herein are performed or facilitated by one or more of the biasing component 810, the timing module 815, and the VREF controller 805.

Reference component 820 may include various components to generate a reference signal for sense component 125-a. In some cases, reference component 820 receives a version of the reference voltage generated by memory cells 105-b. The reference voltage may be in analog form or digital form. Reference component 820 may include circuitry specifically configured to produce a reference signal using the reference voltage from memory cells 105-b. In some examples, reference component 820 may be configured to output a voltage with a value between the two sense voltages, as described with reference to FIG. 3.

Sense component 125-a may use the reference signal to perform certain operations. For example, sense component 125-a may compare a signal from memory cells 105-b (through digit line 115-d) with a reference signal from reference component 820. Upon determining the logic state, sense component 125-a may then store the output in latch 825, where it may be used in accordance with the operations of an electronic device using the memory device of which memory array 100-a is a part.

Figure 9:
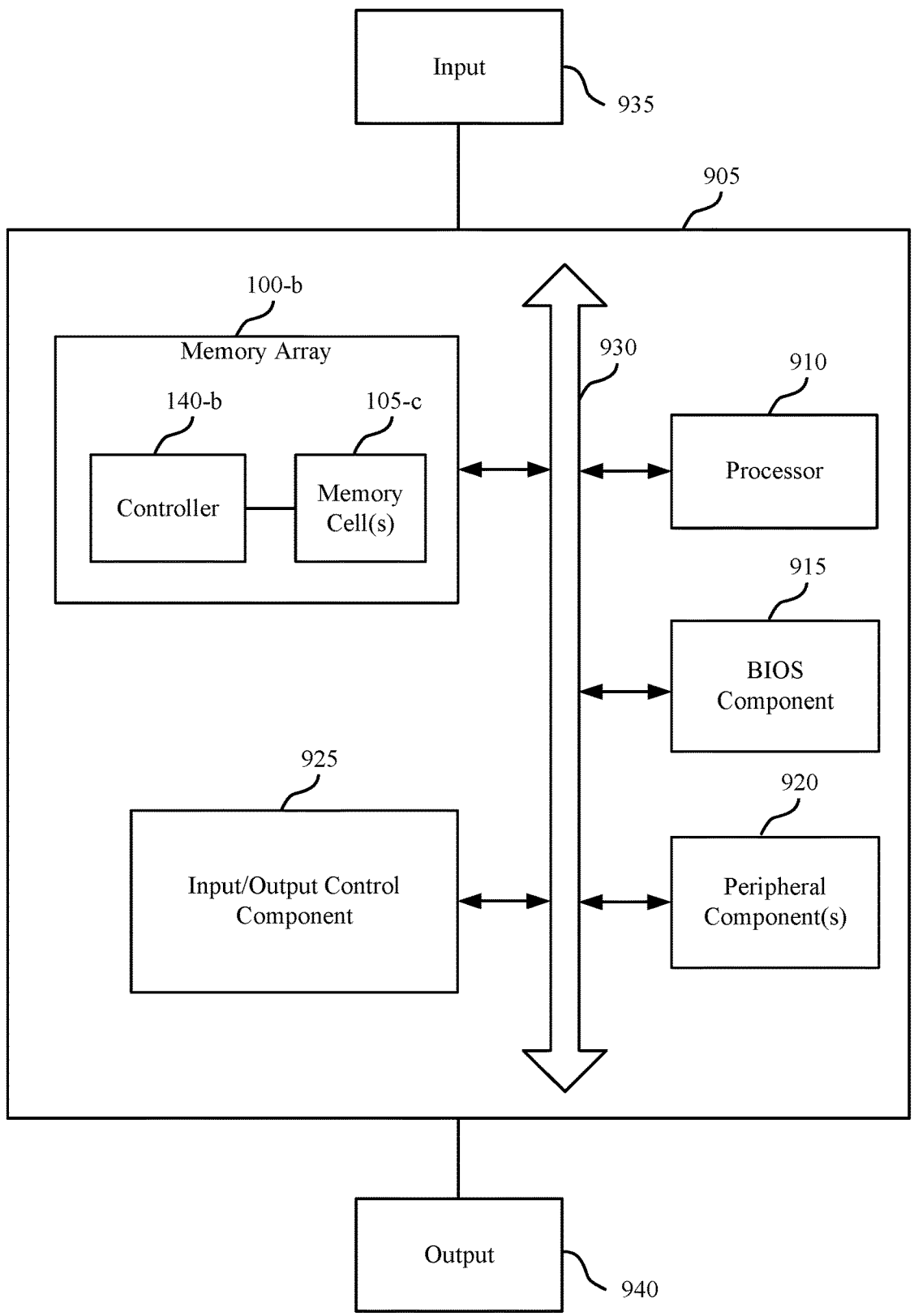
FIG. 9 illustrates a device, including a memory array, that supports cell-based reference voltage generation in accordance with various embodiments of the present disclosure.

FIG. 9 illustrates a system 900 that supports cell-based reference voltage generation in accordance with various embodiments of the present disclosure. System 900 includes a device 905, which may be or include a printed circuit board to connect or physically support various components. Device 905 includes a memory array 100-b, which may be an example of memory array 100 described with reference to FIG. 1 and FIG. 8. Memory array 100-b may contain memory controller 140-b and memory cell(s) 105-c, which may be examples of memory controller 140 described with reference to FIGS. 1 and 8 and memory cells 105 described with reference to FIGS. 1, 2, 4, 6, and 8. Device 905 may also include a processor 910, BIOS component 915, peripheral component(s) 920, and input/output control component 925. The components of device 905 may be in electronic communication with one another through bus 930.

Processor 910 may be configured to operate memory array 100-a through memory controller 140-b. Controller 140-b may be an example of the memory controller 140, the memory controller 140-a, the VREF controller 805, or combination thereof. In some cases, processor 910 may perform the functions of memory controller 140 described with reference to FIGS. 1 and 8 or the VREF controller 805 described with reference to FIG. 8. In other cases, memory controller 140-b may be integrated into processor 910. Processor 910 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 910 may perform various functions described herein, including cell-based reference voltage generation. Processor 910 may, for example, be configured to execute computer-readable instructions stored in memory array 100-b to cause device 905 perform various functions or tasks.

BIOS component 915 may be a software component that includes a basic input/output system (BIOS) operated as firmware, which may initialize and run various hardware components of system 900. BIOS component 915 may also manage data flow between processor 910 and the various components, e.g., peripheral components 920, input/output control component 925, etc. BIOS component 915 may include a program or software stored in read-only memory (ROM), flash memory, or any other non-volatile memory.

Peripheral component(s) 920 may be any input or output device, or an interface for such devices, that is integrated into device 905. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 925 may manage data communication between processor 910 and peripheral component(s) 920, input devices 935, or output devices 940. Input/output control component 925 may also manage peripherals not integrated into device 905. In some cases, input/output control component 925 may represent a physical connection or port to the external peripheral.

Input 935 may represent a device or signal external to device 905 that provides input to device 905 or its components. This may include a user interface or interface with or between other devices. In some cases, input 935 may be a peripheral that interfaces with device 905 via peripheral component(s) 920 or may be managed by input/output control component 925.

Output device 940 may represent a device or signal external to device 905 configured to receive output from device 905 or any of its components. Examples of output device 940 may include a display, audio speakers, a printing device, another processor or printed circuit board, etc. In some cases, output 940 may be a peripheral that interfaces with device 905 via peripheral component(s) 920 or may be managed by input/output control component 925.

The components of memory controller 140-b, device 905, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 10:
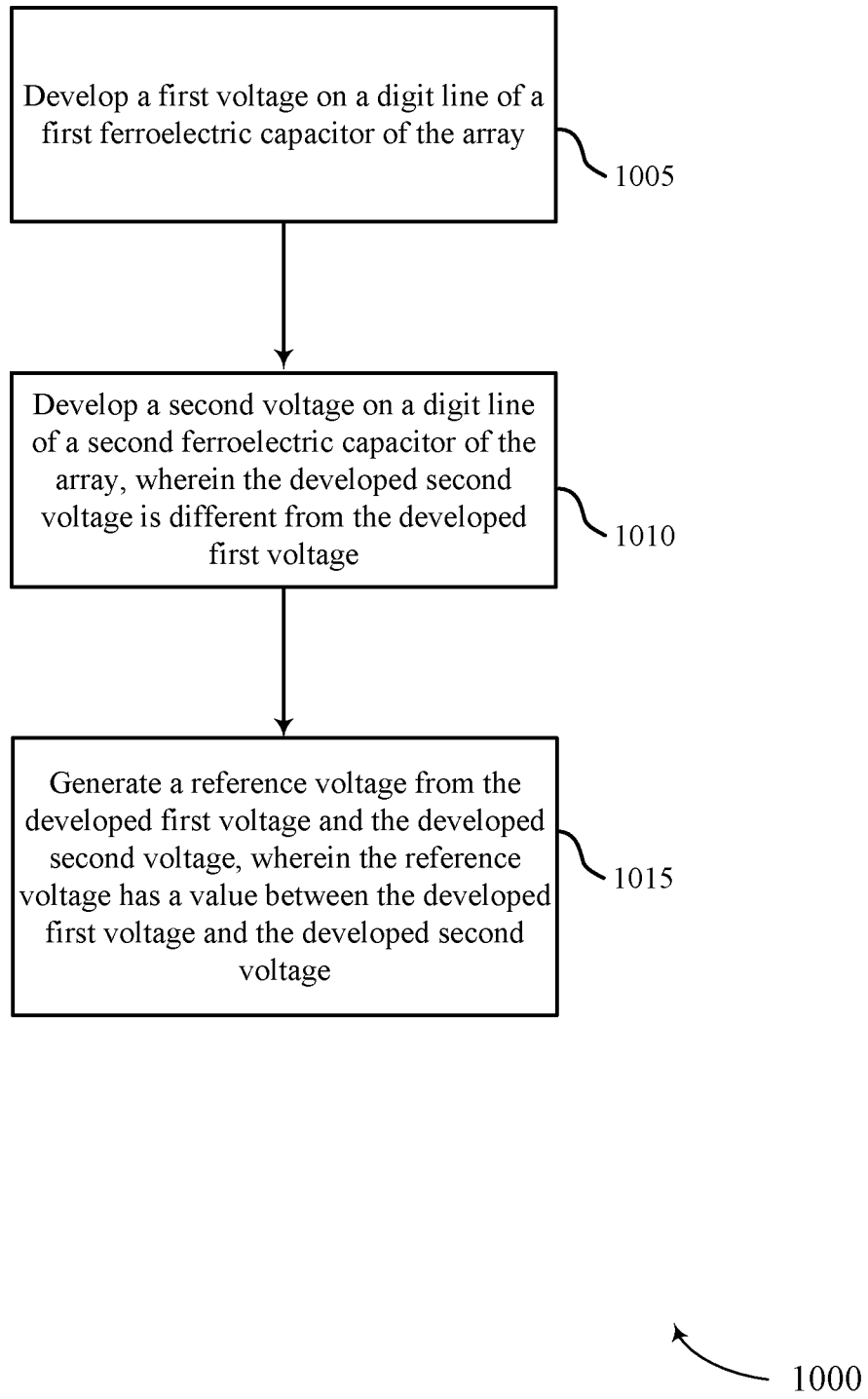
FIGS. 10 and 11 are flowcharts that illustrate a method or methods for cell-based reference voltage generation in accordance with various embodiments of the present disclosure.

FIG. 10 shows a flowchart illustrating a method 1000 for cell-based reference voltage generation in accordance with various embodiments of the present disclosure. The operations of method 1000 may be implemented by a memory array 100, as described with reference to FIGS. 1, 8, and 9. For example, the operations of method 1000 may be performed by a memory controller 140, as described with reference to FIGS. 1, 8, and 9. In some examples, a memory controller 140 may execute a set of codes to control the functional elements of the memory array 100 to perform the functions described below. Additionally or alternatively, the memory controller 140 may perform aspects the functions described below using special-purpose hardware.

At block 1005, the method may include developing a first voltage on a digit line of a first ferroelectric capacitor of the array. In some cases, the method includes applying a voltage to a plate of the first ferroelectric capacitor. In such cases, the first voltage is developed based at least in part on the application. In certain examples, the operations of block 1005 may be performed or facilitated by the VREF controller 805, or the biasing component 810, as described with reference to FIG. 8.

At block 1010, the method may include developing a second voltage on a digit line of a second ferroelectric capacitor of the array. The developed second voltage may be different from the developed first voltage. In some cases, the method includes applying a voltage to a plate of the second ferroelectric capacitor. In such cases, the second voltage is developed based at least in part on the application.

In some examples, the method includes activating a first selection component that is in electronic communication with the first ferroelectric capacitor to select the first ferroelectric capacitor and activating a second selection component that is in electronic communication with the second ferroelectric capacitor to select the second ferroelectric capacitor. The first ferroelectric capacitor and the second ferroelectric capacitor may be selected based at least in part on a power-up operation of the array of ferroelectric memory cells. Alternatively, the first ferroelectric capacitor and the second ferroelectric capacitor may be selected in response to a user input. In certain examples, the operations of block 1010 may be performed or facilitated by the VREF controller 805, or the biasing component 810, as described with reference to FIG. 8.

At block 1015, the method may include generating a reference voltage from the developed first voltage and the developed second voltage. The reference voltage may have a value between the developed first voltage and the developed second voltage. The value of the reference voltage may be an average of the first voltage and the second voltage. In some cases, storing the reference voltage includes activating a first selection component that is in electronic communication with the first ferroelectric capacitor, activating a second selection component that is in electronic communication with the second ferroelectric capacitor, and detecting the reference voltage at a node that connects a first digit line of the first selection component and a second digit line of the second selection component.

The method may further include activating one or more additional switching components that are in electronic communication with the first digit line and the second digit line. The reference voltage may be detected based at least in part on activating the one or more additional switching components. In some examples, the reference voltage is converted from an analog signal to a digital signal. In some cases, the method includes applying a voltage to a plate of the first ferroelectric capacitor and a voltage to a plate of the second ferroelectric capacitor to restore a first state of the first ferroelectric capacitor and a second state of the second ferroelectric capacitor. The application of the voltages may be based at least in part on a periodic timing schedule. The application of the voltages may be based at least in part on a temperature change of the array. In certain examples, the operations of block 1015 may be performed or facilitated by the VREF controller 805, or the biasing component 810, as described with reference to FIG. 8.

Figure 11:
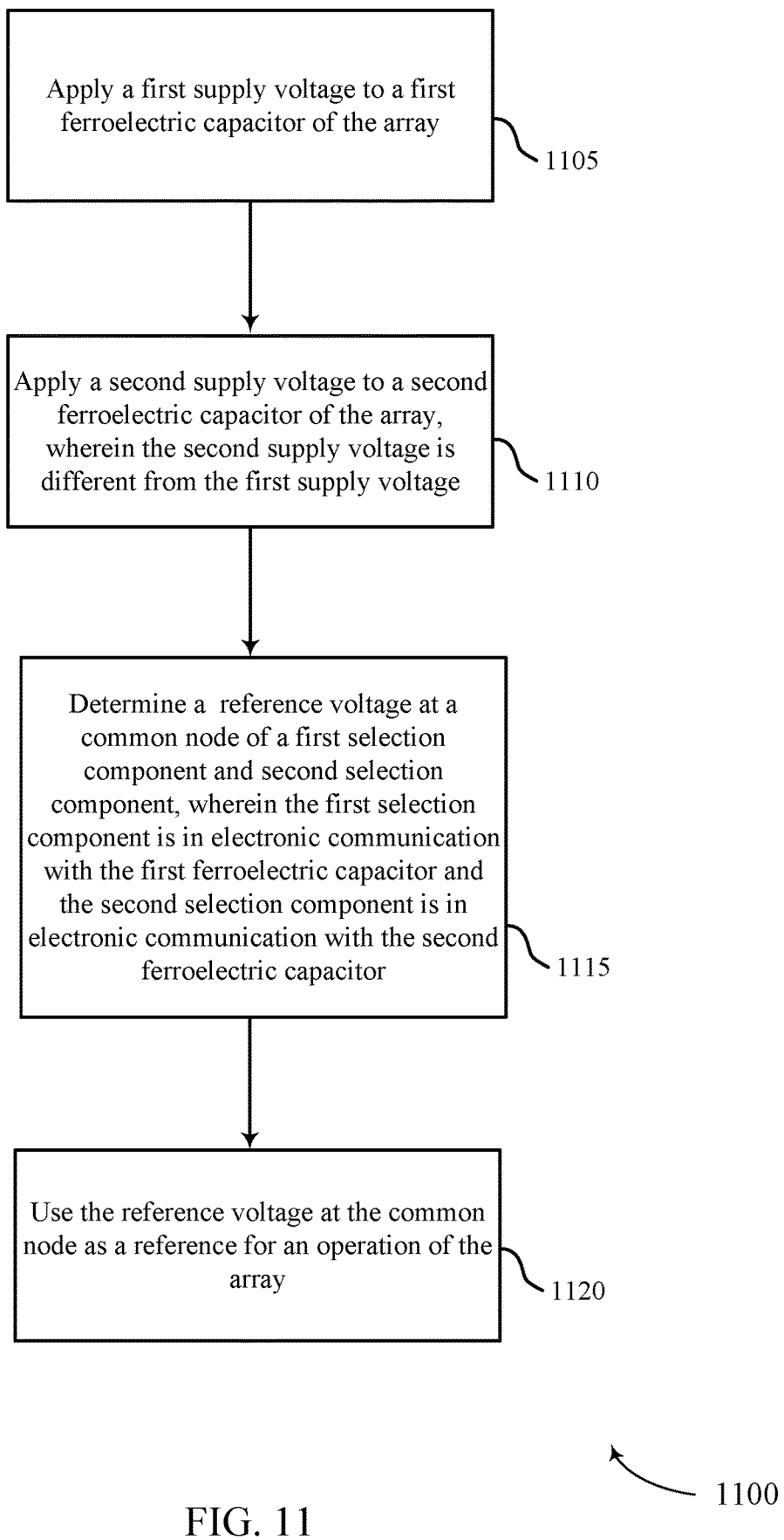

FIG. 11 shows a flowchart illustrating a method 1100 for cell-based reference voltage generation in accordance with various embodiments of the present disclosure. The operations of method 1100 may be implemented by a memory array 100, as described with reference to FIGS. 1, 8, and 9. For example, the operations of method 1100 may be performed by a memory controller 140, as described with reference to FIGS. 1, 8, and 9. In some examples, a memory controller 140 may execute a set of codes to control the functional elements of the memory array 100 to perform the functions described below. Additionally or alternatively, the memory controller 140 may perform aspects the functions described below using special-purpose hardware.

At block 1105, the method may include applying a first supply voltage to a first ferroelectric capacitor of the memory array. In some cases, the method includes applying a first write voltage to a first switching component that is in electronic communication with the first selection component. In such cases, the first supply voltage is applied based at least in part on applying the first write voltage. In certain examples, the operations of block 1105 may be performed or facilitated by the VREF controller 805, or the biasing component 810, as described with reference to FIG. 8.

At block 1110, the method may include applying a second supply voltage to a second ferroelectric capacitor of the array. The second supply voltage may be different from the first supply voltage. In some cases, the method includes applying a second write voltage to a second switching component that is in electronic communication with the second selection component. In such cases, the second supply voltage is applied based at least in part on applying the second write voltage. In certain examples, the operations of block 1110 may be performed or facilitated by the VREF controller 805, or the biasing component 810, as described with reference to FIG. 8.

At block 1115, the method may include determining a reference voltage at a common node of a first selection component and second selection component. The first selection component may be in electronic communication with the first ferroelectric capacitor and the second selection component may be in electronic communication with the second ferroelectric capacitor. In some cases, the method includes applying an activation voltage to one or more switching components that are in electronic communication with a first digit line of the first selection component and a second digit line of the second selection component. In such cases, determining the reference voltage at the common node is based at least in part on the application of the activation voltage. In certain examples, the operations of block 1115 may be performed or facilitated by the VREF controller 805, or the biasing component 810, as described with reference to FIG. 8.

At block 1120, the method may include using the reference voltage at the common node as a reference for an operation of the memory array. In certain examples, the operations of block 1120 may be performed or facilitated by the VREF controller 805, or the biasing component 810, as described with reference to FIG. 8.

Thus, methods 1000 and 1100 may provide for cell-based reference voltage generation. It should be noted that methods 1000 and 1100 describe possible implementations, and the operations and steps may be rearranged or otherwise modified such that other implementations are possible. In some examples, aspects from two or more of the methods 1000 and 1100 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed). The term "isolated" refers to a relationship between components in which electrons are not presently flowing between the components. For example, two components physically connected by a switch may be isolated from each other when the switch is open. The term "hard-wired" refers to a relationship between components in which the components are directly connected without any intermediary components between them.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
coupling a first capacitor of a memory device with a first voltage source via a first digit line, wherein a first portion of a reference voltage is stored on the first capacitor based at least in part on coupling the first capacitor the first voltage source, wherein coupling the first capacitor to the first voltage source is based at least in part on activating a first switching component to selectively couple the first capacitor to the first digit line and activating a second switching component to couple the first voltage source to the first digit line;

coupling a second capacitor of the memory device with a second voltage source different than the first voltage source via a second digit line, wherein a second portion of the reference voltage is stored on the second capacitor based at least in part on coupling the second capacitor to the second voltage source;

determining a first voltage of the first capacitor and a second voltage of the second capacitor based at least in part on coupling the first capacitor with the first voltage source and coupling the second capacitor with the second voltage source;

sharing a charge between the first digit line and the second digit line based at least in part on the first digit line comprising the first voltage and the second digit line comprising the second voltage; and storing the reference voltage that is based at least in part on the charge shared between the first digit line and the second digit line.

2. The method of claim 1, further comprising:
activating the first switching component that is in electronic communication with the first capacitor and the second capacitor; and
activating the second switching component that is in electronic communication with the first capacitor and the second capacitor, wherein the reference voltage is stored based at least in part on activating the first switching component and the second switching component.

3. The method of claim 1, further comprising:
detecting a trigger condition; and
activating a first selection component in electronic communication with the first capacitor and the first voltage source and a second selection component in electronic communication with the second capacitor and the second voltage source is based at least in part on detecting the trigger condition.

4. The method of claim 3, wherein the trigger condition comprises at least one of a temperature change, a timer expiration, an operation threshold, or an error correction code (ECC) event.

5. The method of claim 1, further comprising:
storing an output of an analog-to-digital converter that is in electronic communication with the first digit line coupled with the first capacitor and the second digit line coupled with the second capacitor as the reference voltage.

6. A method, comprising:
identifying a first portion of a reference voltage signal based at least in part on a first voltage of a first digit line, wherein the reference voltage signal is associated with performing a read operation associated with an array of memory cells;
identifying a second portion of the reference voltage signal based at least in part on a second voltage of a second digit line;
storing the first portion of the reference voltage signal on a first memory cell of the array of memory cells;
coupling the first memory cell to a first voltage source, wherein storing the first portion of the reference voltage signal on the first memory cell is based at least in part on coupling the first memory cell to the first voltage source, wherein coupling the first memory cell to the first voltage source is based at least in part on activating a first switching component to selectively couple the first memory cell to the first digit line and activating a second switching component to couple the first voltage source to the first digit line;

storing the second portion of the reference voltage signal on a second memory cell of the array of memory cells;
coupling the second memory cell to a second voltage source different from the first voltage source, wherein storing the second portion of the reference voltage signal on the second memory cell is based at least in part on coupling the second memory cell to the second voltage source; and
sharing a charge between the first digit line and the second digit line based at least in part on storing the second portion of the reference voltage signal on the second memory cell of the array of memory cells, wherein the charge is shared based at least in part on shorting the first digit line to the second digit line, and wherein the reference voltage signal is based at least in part on sharing the charge between the first digit line and the second digit line.

7. The method of claim 6, wherein the reference voltage signal is based at least in part on a voltage difference between the first portion stored on the first memory cell and the second portion stored on the second memory cell.

8. The method of claim 6, wherein at least one of the first voltage source or the second voltage source is a virtual ground.

9. A method, comprising:
identifying a first portion of a reference voltage signal based at least in part on a first voltage of a first digit line, wherein the reference voltage signal is associated with performing a read operation associated with an array of memory cells;
identifying a second portion of the reference voltage signal based at least in part on a second voltage of a second digit line;
storing the first portion of the reference voltage signal on a first memory cell of the array of memory cells;
coupling the first memory cell to a first voltage source, wherein storing the first portion of the reference voltage signal on the first memory cell is based at least in part on coupling the first memory cell to the first voltage source;
storing the second portion of the reference voltage signal on a second memory cell of the array of memory cells;
coupling the second memory cell to a second voltage source different from the first voltage source, wherein storing the second portion of the reference voltage signal on the second memory cell is based at least in part on coupling the second memory cell to the second voltage source, wherein coupling the second memory cell to the second voltage source is based at least in part on activating a third switching component to couple the second memory cell to the second digit line and activating a fourth switching component to couple the second voltage source to the second digit line; and
sharing a charge between the first digit line and the second digit line based at least in part on storing the second portion of the reference voltage signal on the second memory cell of the array of memory cells, wherein the charge is shared based at least in part on shorting the first digit line to the second digit line, and wherein the reference voltage signal is based at least in part on sharing the charge between the first digit line and the second digit line.

10. The method of claim 6, further comprising:
determining whether a refresh condition associated with the reference voltage signal satisfies a threshold, wherein identifying the first portion of the reference voltage signal and identifying the second portion of the reference voltage signal are based at least in part on determining whether the refresh condition satisfies the threshold.

11. The method of claim 10, further comprising:
storing the second portion of the reference voltage signal on the first memory cell based at least in part on the threshold being satisfied; and
storing the first portion of the reference voltage signal on the second memory cell based at least in part on the threshold being satisfied.

12. The method of claim 10, wherein the refresh condition and the threshold are based at least in part on a first temperature of the first memory cell and a second temperature of the second memory cell, or a timer, or a number of access operations performed by the array of memory cells, or an error correction code (ECC) event, or a combination thereof.

13. A method, comprising:
applying a first voltage to a first digit line of an array of memory cells, wherein a first portion of a reference voltage is stored to a first memory cell based at least in part on applying the first voltage to the first digit line, wherein applying the first voltage to the first digit line of the array of memory cells is based at least in part on activating a first switching component to selectively couple the first memory cell to the first digit line and activating a second switching component to couple a first voltage source to the first digit line;
applying a second voltage to a second digit line of the array of memory cells, wherein the second voltage is different from the first voltage, wherein a second portion of the reference voltage is stored to a second memory cell based at least in part on applying the second voltage to the second digit line;
coupling the first digit line with the second digit line based at least in part on applying the first voltage and the second voltage;
sharing a charge between the first digit line and the second digit line based at least in part on coupling the first digit line with the second digit line; and
generating the reference voltage based at least in part on coupling the first digit line with the second digit line and sharing the charge between the first digit line and the second digit line.

14. The method of claim 13, wherein the reference voltage is based at least in part on a voltage difference between the first voltage and the second voltage.

15. The method of claim 13, further comprising:
determining a logic state stored on a memory cell of the array of memory cells based at least in part on the reference voltage.

16. The method of claim 13, further comprising:
activating one or more switching components that are in electronic communication with the first digit line and the second digit line, wherein coupling the first digit line with the second digit line is based at least in part on activating the one or more switching components that includes at least the first switching component and the second switching component.

17. The method of claim 13, further comprising:
coupling the first memory cell of the array of memory cells with the first digit line; and
coupling the second memory cell of the array of memory cells with the second digit line, wherein applying the first voltage and the second voltage is based at least in part on coupling the first memory cell with the first digit line and coupling the second memory cell with the second digit line.

* * * * *